(12) United States Patent
Kamata et al.

(10) Patent No.: US 12,165,846 B2
(45) Date of Patent: Dec. 10, 2024

(54) PLASMA PROCESSING APPARATUS AND PLASMA PROCESSING METHOD

(71) Applicant: TOKYO ELECTRON LIMITED, Tokyo (JP)

(72) Inventors: Eiki Kamata, Yamanashi (JP); Taro Ikeda, Yamanashi (JP); Haruhiko Furuya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 501 days.

(21) Appl. No.: 17/411,992

(22) Filed: Aug. 25, 2021

(65) Prior Publication Data

US 2022/0068606 A1 Mar. 3, 2022

(30) Foreign Application Priority Data

Aug. 28, 2020 (JP) ................. 2020-145020

(51) Int. Cl.
*H01J 37/32* (2006.01)
*C23C 16/455* (2006.01)

(52) U.S. Cl.
CPC .. *H01J 37/32311* (2013.01); *C23C 16/45536* (2013.01); *C23C 16/45544* (2013.01); *H01J 37/3222* (2013.01); *H01J 37/32238* (2013.01); *H01J 37/32449* (2013.01); *H01J 37/32834* (2013.01); *H01J 2237/332* (2013.01)

(58) Field of Classification Search
CPC .............. H01J 37/32; H01J 2237/3321; H01J 2237/3323; H01J 37/32311; H01J 37/3222; H01J 37/32238; H01J 37/32449; H01J 37/32834; H01J 2237/332; H01J 37/32192; H01J 37/32458; C23C 16/455; C23C 16/45536; C23C 16/45544; C23C 16/52

See application file for complete search history.

(56) References Cited

U.S. PATENT DOCUMENTS 9,048,070 B2 6/2015 Tian et al.
10,480,073 B2 11/2019 Murakawa
(Continued)

FOREIGN PATENT DOCUMENTS

JP 2017-103454 A 6/2017
JP 2017-147129 A 8/2017
(Continued)

*Primary Examiner* — Andres Munoz
*Assistant Examiner* — William C. Trice, III
(74) *Attorney, Agent, or Firm* — Fenwick & West LLP

(57) ABSTRACT

There is provided a plasma processing apparatus. The apparatus comprises a chamber having a processing space for performing plasma processing on a substrate and a combining space for combining electromagnetic waves, a dielectric window separating the processing space from the combining space, an antenna unit having a plurality of antennas radiating the electromagnetic waves to the combining space and functioning as a phased array antenna, an electromagnetic wave output unit that outputs the electromagnetic waves to the antenna unit, a stage on which the substrate is placed, a gas supply unit that supplies a gas for ALD film formation to the processing space, and a controller that controls the gas supply unit to supply the gas to perform the ALD film formation and control localized plasma to move at a high speed in the processing space by causing the antenna unit to function as the phased array antenna.

12 Claims, 11 Drawing Sheets

(56) References Cited

U.S. PATENT DOCUMENTS

| | | | |
|---|---|---|---|
| 10,734,198 B2 | 8/2020 | Brandon et al. | |
| 2012/0186521 A1* | 7/2012 | Iwasaki | H01L 21/02274 |
| | | | 118/723 AN |
| 2014/0312767 A1 | 10/2014 | Tian et al. | |
| 2015/0361553 A1 | 12/2015 | Murakawa | |
| 2017/0040145 A1 | 2/2017 | Brandon et al. | |
| 2017/0133202 A1* | 5/2017 | Berry, III | C23C 16/45565 |
| 2018/0342374 A1* | 11/2018 | Liang | H01J 37/3211 |

FOREIGN PATENT DOCUMENTS

| | | |
|---|---|---|
| JP | 2017-521556 A | 8/2017 |
| JP | 2018-059173 A | 4/2018 |
| KR | 10-2014-0061558 A | 5/2014 |
| KR | 10-2015-0138173 A | 12/2015 |
| WO | WO 2015/193155 A1 | 12/2015 |

\* cited by examiner

PLASMA PROCESSING APPARATUS AND PLASMA PROCESSING METHOD

CROSS-REFERENCE TO RELATED APPLICATIONS

This application claims priority to Japanese Patent Application No. 2020-145020, filed on Aug. 28, 2020, which is hereby incorporated by reference in its entirety.

TECHNICAL FIELD

The present disclosure relates to a plasma processing apparatus and a plasma processing method.

BACKGROUND

For example, in a semiconductor device manufacturing process, plasma atomic layer deposition (ALD), in which a source gas and a reaction gas are alternately supplied in a state where plasma exists, is known as a method for forming a film on a semiconductor wafer that is a substrate. Accordingly, it is possible to form a film having high reactivity and good step coverage.

SUMMARY

The present disclosure provides a plasma processing apparatus and a plasma processing method capable of performing an ALD process that ensures small gap, high uniformity, and less damage to a substrate.

In accordance with an aspect of the present disclosure, there is provided a plasma processing apparatus. The apparatus comprises a chamber having a processing space for performing plasma processing on a substrate and a combining space for combining electromagnetic waves, a dielectric window that separates the processing space from the combining space, an antenna unit having a plurality of antennas configured to radiate the electromagnetic waves to the combining space and functioning as a phased array antenna, an electromagnetic wave output unit configured to output the electromagnetic waves to the antenna unit, a stage on which the substrate is placed in the processing space, a gas supply unit configured to supply a gas for ALD film formation to the processing space, and a controller configured to control the gas supply unit to supply the gas to perform the ALD film formation and control localized plasma to move at a high speed in the processing space by causing the antenna unit to function as the phased array antenna.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

<Plasma Processing Apparatus>

Figure 1:
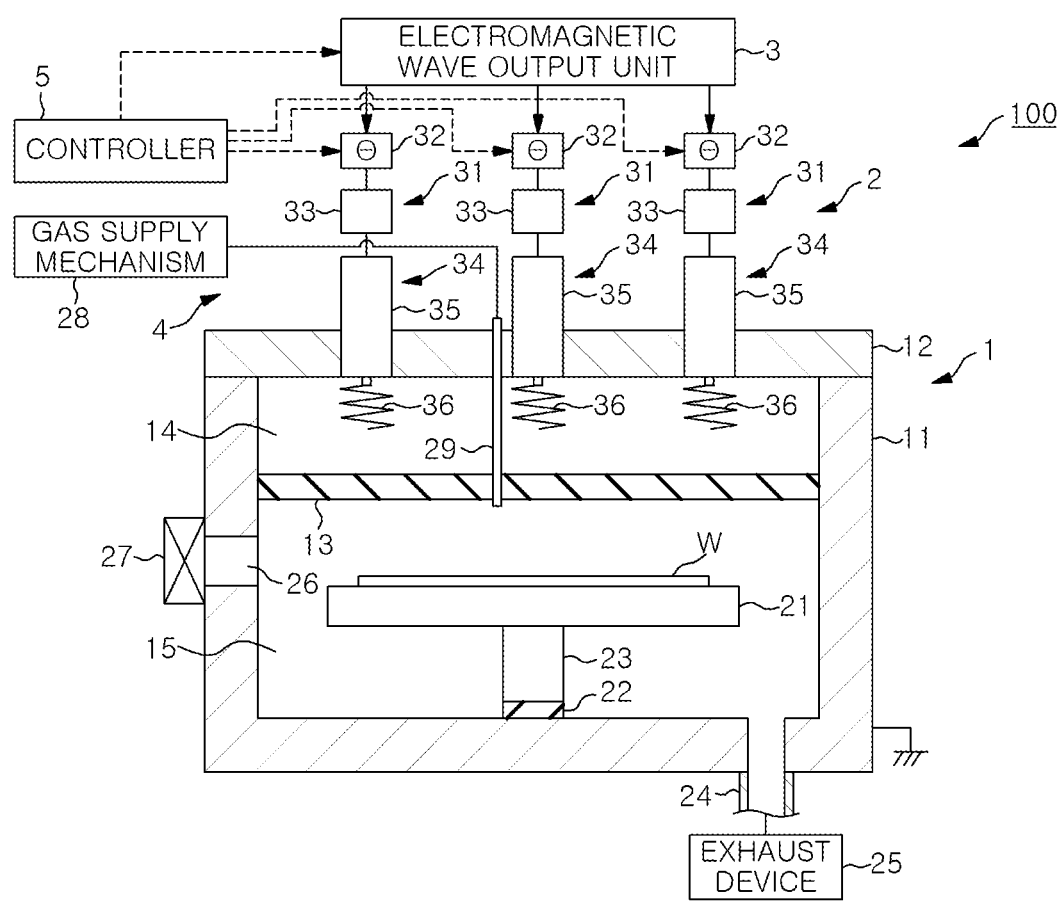
FIG. 1 is a cross-sectional view showing a plasma processing apparatus according to an embodiment.

FIG. 1 is a cross-sectional view showing a plasma processing apparatus according to an embodiment.

A plasma processing apparatus 100 of the present embodiment generates plasma (mainly, surface wave plasma) using electromagnetic waves (microwaves), and performs ALD film formation on a substrate W by using the generated surface wave plasma. The substrate W may be typically a semiconductor wafer. However, the substrate W is not limited thereto, and may be another substrate such as an FPD substrate, a ceramic substrate, or the like.

The plasma processing apparatus 100 includes a chamber 1, an antenna unit 2, an electromagnetic wave output unit 3, a gas supply unit 4, and a controller 5.

The chamber 1 has a substantially cylindrical container 11 having an upper opening and a ceiling plate 12 for covering the upper opening of the container 11. The chamber 1 is made of a metal such as aluminum, stainless steel, or the like in one embodiment.

A space in the chamber 1 is divided into an upper space and a lower space by a dielectric window 13. The space above the dielectric window 13 serves as a combining space 14 for combining electromagnetic waves, and the space below the dielectric window 13 serves as a processing space 15 for performing plasma processing on the substrate W.

The dielectric window 13 is made of, for example, ceramic such as quartz, alumina ($Al_2O_3$), or the like, a fluorine-based resin such as polytetrafluoroethylene or the like, or a polyimide-based resin.

The combining space 14 is an atmospheric space. The electromagnetic waves are radiated into the combining space 14 from a plurality of antennas (to be described later) of the antenna unit 2, and are combined/synthesized in the combining space 14.

A disc-shaped stage 21 for placing the substrate W thereon in a horizontal state is disposed in the processing space 15, and the surface wave plasma for processing the substrate W is generated in the processing space 15. The processing space 15 is maintained in a vacuum state during plasma processing.

The stage 21 is supported by a tubular support member 23 standing upright via an insulating member 22. The stage 21 may be a dielectric member made of, for example, a metal such as aluminum having an anodically oxidized surface, ceramic, or the like. The stage 21 may be provided with an electrostatic chuck for attracting and holding the substrate W, a heating mechanism, a gas flow path for supplying a heat transfer gas to a backside of the substrate W, or the like.

Further, a radio frequency bias power supply may be electrically connected to the stage 21 through a matching unit. By supplying a radio frequency power from the radio frequency bias power supply to the stage 21, ions in the plasma are attracted toward the substrate W.

A gap between the stage 21 and the dielectric window 13 is 70 mm or less in one embodiment. Accordingly, ALD film formation can be performed efficiently.

An exhaust line 24 is connected to a bottom portion of the chamber 1, and an exhaust device 25 including a pressure control valve or a vacuum pump is connected to the exhaust line 24. When the exhaust device 25 is driven, the processing space 15 of the chamber 1 is evacuated to a predetermined degree of vacuum. A loading/unloading port 26 for loading/unloading the substrate W and a gate valve 27 for opening/closing the loading/unloading port 26 are disposed on a sidewall of the chamber 1.

The gas supply unit 4 includes a gas supply mechanism 28 for supplying a gas required for film formation using ALD, and a gas introducing member 29 for introducing the gas supplied from the gas supply mechanism 28 into the processing space 15. The gas supply mechanism 28 is configured to supply a first gas and a second gas for performing an ALD process, and an inert gas serving as a plasma generating gas or a purge gas. The gas supply mechanism 28 has a plurality of gas supply sources for supplying these gases, lines for supplying these gases, valves or flow rate controllers disposed in the line, or the like. In the ALD process, the first gas and the second gas are alternately supplied from the gas supply mechanism 28 with a purge process using the purge gas interposed therebetween. The gas introducing member 29 penetrates through the central portions of the ceiling plate 12 and the dielectric window 13 from a position above the ceiling plate 12 and reaches the central portion of the processing space 15. The gas introducing member 29 is configured to supply a gas to the central portion of the substrate W (the position corresponding to the central portion of the substrate W). Although one gas introducing member 29 is illustrated in FIG. 1, two gas introducing members 29 may be provided to supply the first gas and the second gas separately. Since the gas introducing member 29 supplies the gas from the central portion of the dielectric window 13 to the central portion of the substrate W, the gas can be uniformly supplied to the substrate W. Although the gas may be supplied from an outer peripheral side of the substrate W, it is preferable to supply the gas to the central portion of the substrate W. This is because, in the ALD process, a period in which a gas is supplied once is short and it may be difficult to supply the gas to the central portion of the substrate W by supplying the gas from the outer peripheral side. Alternatively, the gas may be supplied from both of the central portion and the outer peripheral portion of the substrate W.

The antenna unit 2 radiates the electromagnetic waves outputted from the electromagnetic wave output unit 3 from the position above the chamber 1 to the combining space 14 in the chamber 1. The antenna unit 2 includes a plurality of antenna modules 31. The antenna module 31 has a phase shifter 32, an amplifier unit 33, and an electromagnetic wave radiation unit 34. The electromagnetic wave radiation unit 34 has a transmission line 35 for transmitting the electromagnetic wave amplified by the amplifier unit 33, and an antenna 36 extending from the transmission line 35 and configured to radiate the electromagnetic wave into the combining space 14. The phase shifter 32 and the amplifier unit 33 of the antenna module 31 are disposed above the chamber 1. FIG. 1 shows an example in which a helical antenna is used as the antenna 36. However, the helical antenna is merely an example, and the antenna 36 is not limited thereto. The helical antenna is used because it has high directivity in an axial direction and reduces mutual coupling between the antennas.

The phase shifters 32 change the phases of the electromagnetic waves, and are configured to advance or delay the phases of the electromagnetic waves radiated from the antenna 36. By adjusting the phases of the electromagnetic waves using the phase shifters 32, it is possible to concentrate the electromagnetic waves at a desired position of the dielectric window 13 using the interference of the electromagnetic waves radiated from the antennas 36.

The amplifier unit 33 includes a variable gain amplifier, a main amplifier constituting a solid state amplifier, and an isolator. The variable gain amplifier is configured to adjust power level of the electromagnetic wave inputted to the main amplifier, adjust variation in each antenna module 31, or adjust the intensity of the electromagnetic wave. The main amplifier may include an input matching circuit, a semiconductor amplifying device, an output matching circuit, and a high Q resonance circuit. The isolator isolates the electromagnetic wave reflected by the antenna 36 and directed toward the main amplifier.

The transmission line 35 of the electromagnetic wave radiation unit 34 is fitted into the ceiling plate 12, and the lower end of the transmission line 35 is located at the same height as that of the inner wall of the ceiling plate 12. The antenna 36 extends from the lower end of the transmission line 35 into the combining space 14 so that the axis thereof extends in the vertical direction. In other words, the antenna 36 extends from the inner surface of the upper wall of the combining space 14 into the combining space 14. The antenna 36 may be made of copper, brass, silver-plated aluminum, or the like.

Figure 2:
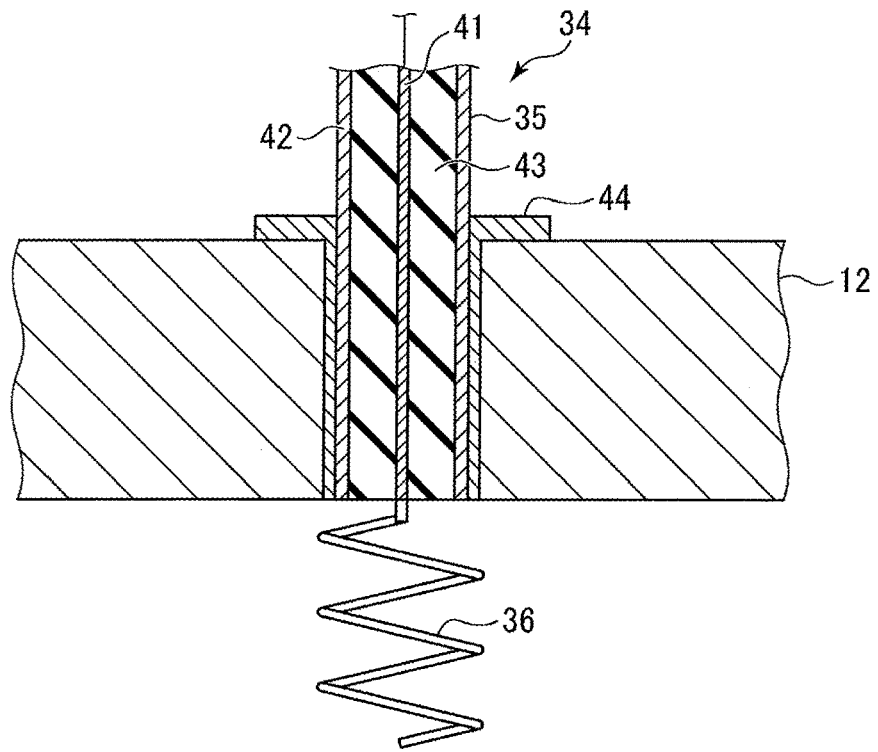
FIG. 2 is a cross-sectional view specifically showing an electromagnetic wave radiation unit according to one embodiment.

As shown in FIG. 2, the transmission line 35 is provided with an inner conductor 41 disposed at the center of the transmission line 35, an outer conductor 42 disposed around the inner conductor 41, and a dielectric member 43 such as Teflon disposed therebetween. The transmission line 35 has a coaxial cable shape. A reference numeral 44 indicates a sleeve. The antenna 36 is connected to the inner conductor 41.

Figure 3:
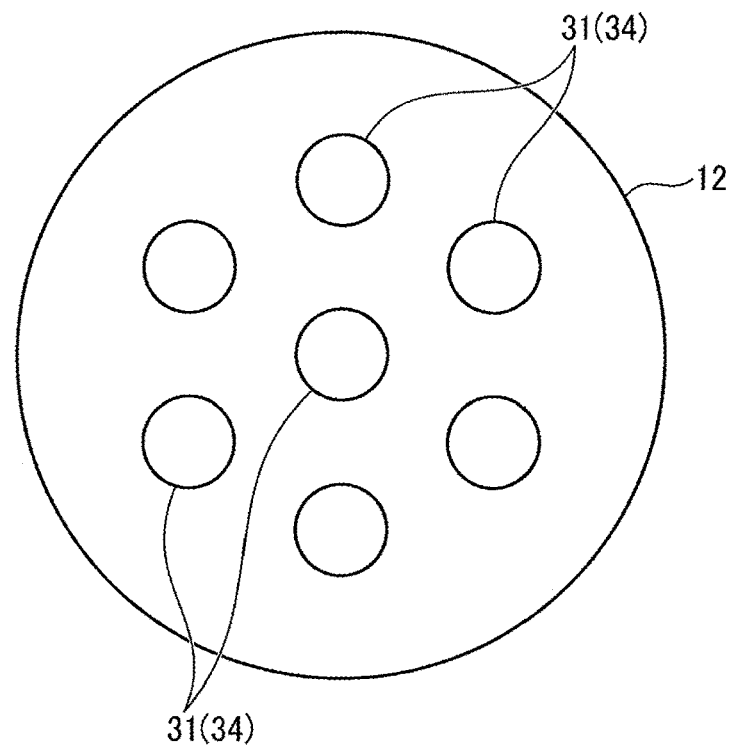
FIG. 3 schematically shows arrangement of antenna modules in the plasma processing apparatus of FIG. 1 according to one embodiment.

The antenna modules 31 (the electromagnetic wave radiation units 34) are uniformly disposed on the ceiling plate 12. The number of antenna modules 31 is appropriately set such that plasma is appropriately generated. In this example, as shown in FIG. 3, seven antenna modules 31 (the electromagnetic wave radiation units 34) are disposed (only three are shown in FIG. 1).

By adjusting the phases of the electromagnetic waves radiated from the antennas 36 using the phase shifters 32 of antenna modules 31, the interference of the electromagnetic waves can occur and the electromagnetic waves can be concentrated on any portion of the dielectric window 13. In other words, the antenna unit 2 functions as a phased array antenna.

Figure 4:
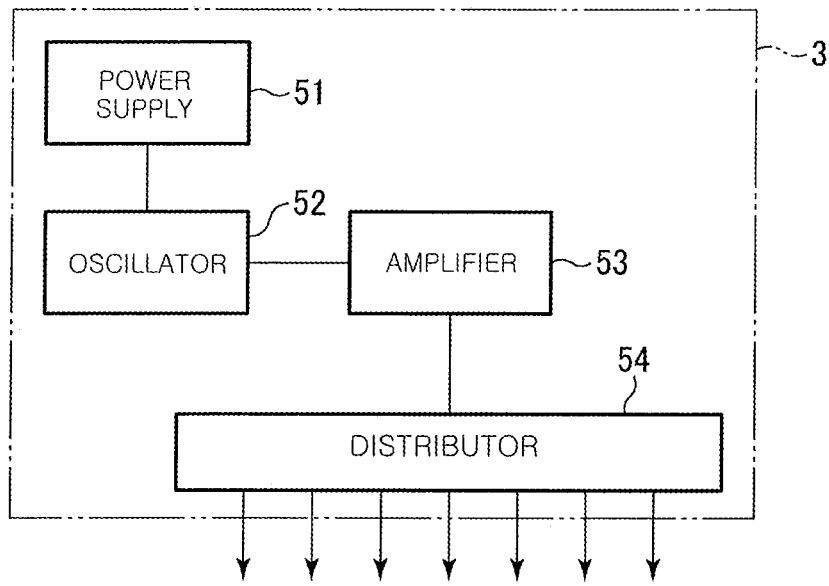
FIG. 4 is a block diagram showing a configuration of an electromagnetic wave output unit in the plasma processing apparatus of FIG. 1 according to one embodiment.

As shown in FIG. 4, the electromagnetic wave output unit 3 includes a power supply 51, an oscillator 52, an amplifier 53 for amplifying the oscillated electromagnetic waves, and a distributor 54 for distributing the amplified electromagnetic waves to each antenna module 31. The electromagnetic wave output unit 3 outputs electromagnetic waves to antenna modules 31.

The oscillator 52 performs, for example, PLL oscillation of the electromagnetic waves having a frequency of 860 MHz. The frequency of the electromagnetic waves is not limited to 860 MHz and a frequency of microwave band in the range of 300 MHz to 3 GHZ can be used suitably as the frequency of the electromagnetic waves. It is also possible to use the electromagnetic waves up to 5 GHz, which are higher in frequency than microwaves. The distributor 54 distributes the electromagnetic waves amplified by the amplifier 53.

The controller 5 has a central processing unit (CPU) and controls individual components of the plasma processing apparatus 100. The controller 5 includes a storage unit for storing control parameters and processing recipes of the plasma processing apparatus 100, an input device, a display, and the like.

The controller 5 controls the power of the electromagnetic wave output unit 3, the gas supply of the gas supply unit 4, the phases of each antenna module 31 in the antenna unit 2, or the like.

Specifically, the controller 5 controls the supply of the first gas, the second gas, and the inert gas by the gas supply unit 4 to perform a desired ALD process.

Further, the controller 5 outputs a control signal to the phase shifter 32 of each antenna module 31, controls the phases of the electromagnetic waves radiated from the electromagnetic wave radiation units 34 (the antennas 36) of antenna modules 31, and causes interference of the electromagnetic waves to concentrate the electromagnetic waves at a desired portion of the dielectric window 13. In other words, the controller 5 controls the antenna unit 2 to function as a phased array antenna. In the following description, concentrating the electromagnetic waves at a desired portion by the phase control is referred to as "concentration."

The controller 5 controls the phase shifter 32 by storing multiple tables showing the relationship between the phase of each antenna module and the concentrating position of the electromagnetic waves in the storage unit in advance and switching the tables at a high speed.

The antenna unit 2, the electromagnetic wave output unit 3, and the controller 5 constitute a plasma source for generating plasma for plasma processing.

<Plasma Processing Method>

The following is description of a plasma processing method performed by the plasma processing apparatus 100 configured as described above. The following operations are performed under the control of the controller 5.

Figure 5:
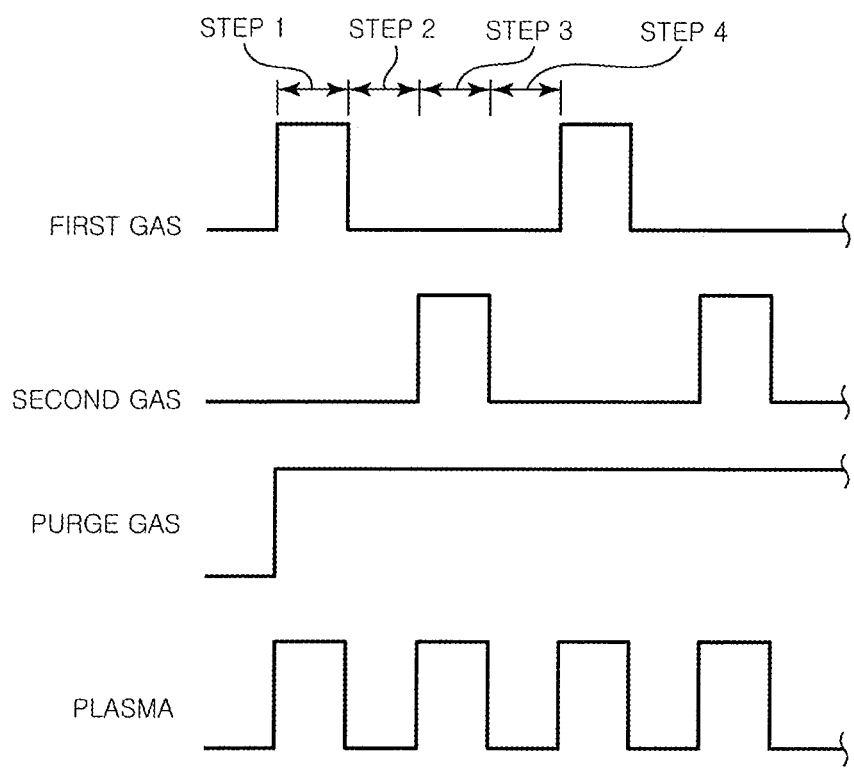
FIG. 5 is a timing chart for explaining film formation using ALD that is plasma processing according to one embodiment.

In the present embodiment, the plasma processing apparatus 100 performs film formation using plasma ALD. In the film formation using plasma ALD, as shown in the timing chart of FIG. 5, a cycle of step 1 (the supply of the first gas to the processing space 15), step 2 (the purge of the processing space 15), step 3 (the supply of the second gas to the processing space 15), and step 4 (the purge of the processing space 15) is repeated multiple times, and plasma is generated in steps 1 and 3. The plasma may be generated in only one of steps 1 and 3. In the example of FIG. 5, the purge gas constantly flows. However, the purge gas may flow only during the purge process.

Figure 6:
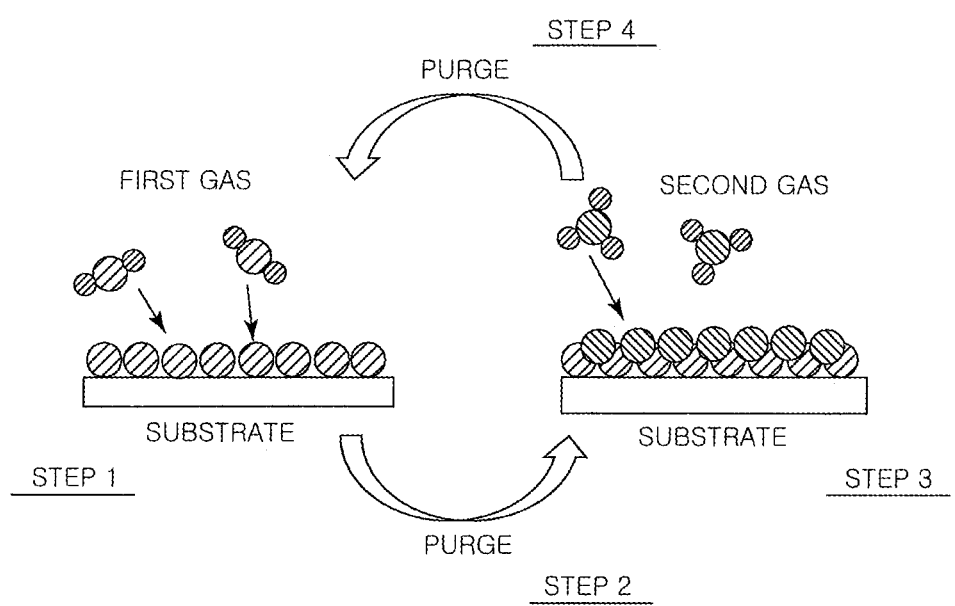
FIG. 6 schematically explains the film formation using ALD that is the plasma processing according to one embodiment.

As shown in FIG. 6, the first gas is absorbed onto the surface of the substrate W in step 1; the first gas is purged from the processing space 15 in step 2; the second gas is adsorbed onto the surface of the substrate W in step 3; and the second gas is purged from the processing space 15 in step 4. During the ALD process, the substrate W is heated by the heating mechanism disposed at the stage 21 to remove ligands of the first gas and the second gas. Generally, since the first gas is a source gas and the second gas is a reaction gas, a thin unit film is formed by reaction between the source gas and the reaction gas in one cycle of steps 1 to 4 and, by repeating this cycle multiple times, a film having a desired film thickness is formed. The purge gas may be an inert gas such as Ar gas, $N_2$ gas, or the like.

In the case of performing the plasma ALD, first, the gate valve 27 is opened, then, the substrate W is loaded by a transfer device (not shown) from a vacuum transfer chamber (not shown) adjacent to the chamber 1 into the evacuated processing space 15 of the chamber 1 through the loading/unloading port 26, and the substrate W is placed on the stage 21.

After the gate valve 27 is closed, the pressure in the processing space 15 is adjusted to a predetermined degree of vacuum by the exhaust device 25 while introducing the inert gas from the gas introducing unit 4 into the processing space 15. Then, the steps 1 to 4 are executed.

As described above, the plasma is generated in step 1 and step 3 (or any one of step 1 and step 3) among steps 1 to 4, and plasma generation at that time is performed as follows.

In other words, the electromagnetic waves output from the electromagnetic wave output unit 3 are supplied to the antenna modules 31 of the antenna unit 2, and radiated from the electromagnetic wave radiation units 34 of the antenna modules 31. The plasma is generated using the electromagnetic waves.

Figure 7:
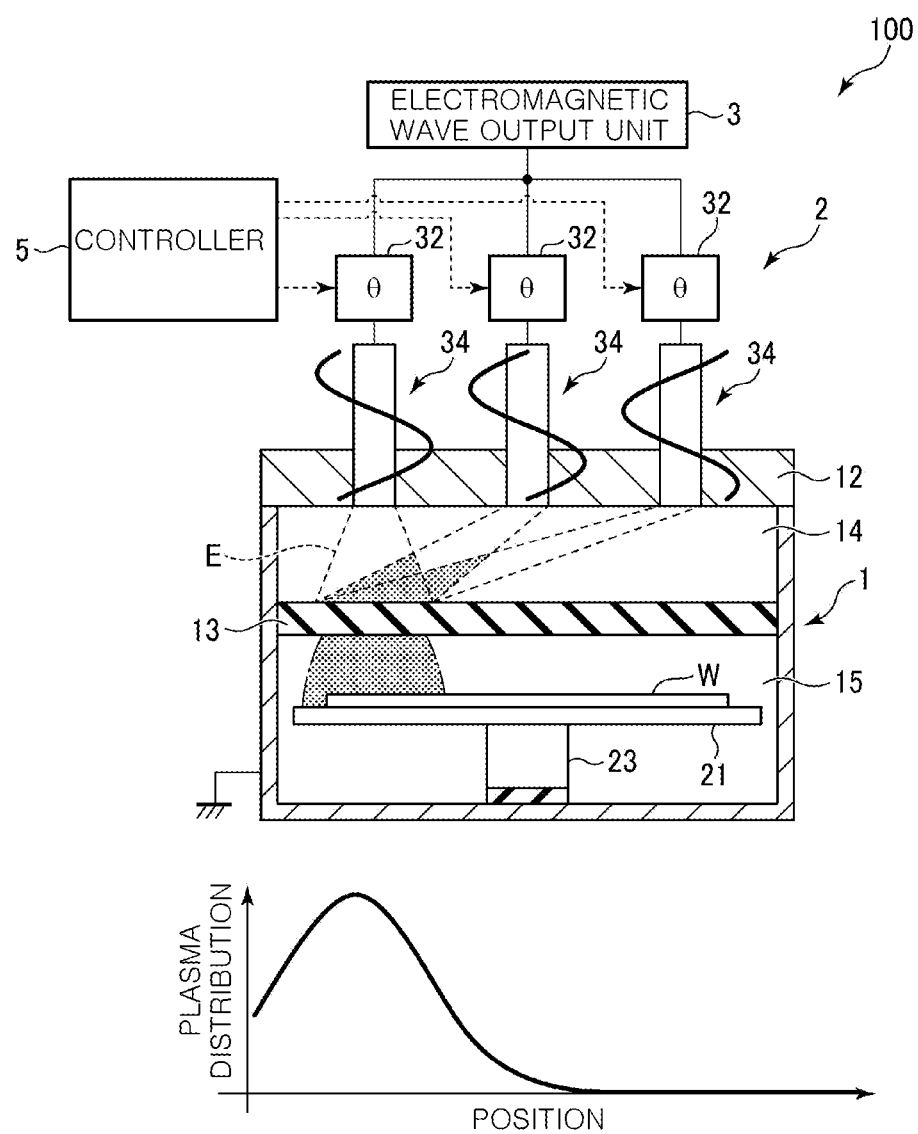
FIG. 7 is a cross-sectional view for explaining a processing state of the plasma processing apparatus according to one embodiment.

At this time, as shown in FIG. 7, the phases of electromagnetic waves E radiated from the electromagnetic wave radiation units 34 (the antennas 36) of antenna modules 31 are controlled by outputting the control signals from the controller 5 to the phase shifters 32. In other word, the antenna unit 2 serves as a phased array antenna. Accordingly, the interference of the electromagnetic waves occurs in the combining space 14, so that a concentrating portion of the electromagnetic waves E, i.e., a portion in which the electromagnetic wave intensity is high, is formed at a desired portion of the dielectric window 13. Further, the concentrating portion of the electromagnetic waves can be moved at a high speed by controlling the phases of the electromagnetic waves E radiated from the electromagnetic wave radiation units 34.

The electromagnetic waves concentrated on the dielectric window 13 transmit through the dielectric window 13, and plasma localized directly below the concentrating portion in the processing space 15 is generated by an electric field. The localized plasma is moved at a high speed by the high-speed movement of the concentrating portion of the electromagnetic waves, so that uniform plasma is generated.

At one position of the dielectric window 13, timing in which an electric field is focused and timing in which there is no electric field exist due to high-speed phase control. In other words, the timing in which plasma is generated and the timing in which plasma is not generated are switched at a high speed by the high-speed phase control. Accordingly, it is possible to generate pseudo pulsed plasma that inflicts less damage compared to conventional microwave plasma.

Since the plasma processing that ensures high plasma uniformity and inflicts less damage compared to the conventional microwave plasma can be realized, the gap between the dielectric window 13 and the stage 21 may be reduced to be suitable for the ALD process. By reducing the gap between the dielectric window 13 and the stage 21, it is possible to reduce the processing space, shorten the period of the purge process in the ALD process, and improve the throughput. From the above, the gap between the dielectric window 13 and the stage 21 is preferably 70 mm or less, more preferably 40 mm or less. Due to the above-described high-speed phase control, it is possible to generate uniform plasma that inflicts less damage even in the case of such a small gap.

Conventionally, the ALD process is performed using a capacitively coupled plasma processing apparatus disclosed in Japanese Patent Application Publication No. 2018-59173 or a microwave plasma processing apparatus that does not use a phased array antenna disclosed in Japanese Patent Application Publication No. 2017-147129. In the capacitively coupled plasma processing apparatus, relatively uniform plasma can be generated by reducing the gap. Since the frequency of the electromagnetic waves is lower than a microwave band, however, it is inherently difficult to perform processing with a high electron temperature and low damage. Further, in the conventional microwave plasma processing apparatus, the wavelength of the electromagnetic waves is within a range of 300 MHz to 3 GHz, which is short. Therefore, the electromagnetic waves reflected by the wall generate standing waves having a large number of nodes and antinodes within a short range directly below the dielectric window 13. Accordingly, it is necessary to diffuse the plasma to obtain plasma uniformity, and the gap between the dielectric window and the stage needs to be increased. Hence, in the case of performing the ALD process using the microwave plasma processing apparatus, time is required to purge the processing space and the throughput is decreased.

On the other hand, in the present embodiment, as described above, the antenna unit 2 serving as a phased array antenna is used to move the concentrating portion of the electromagnetic waves at a high speed and to move the localized plasma generated in the processing space corresponding to the concentrating portion of the electromagnetic waves at a high speed. Accordingly, it is possible to achieve a small gap and the uniformity of the plasma processing while inherently taking advantage of the microwave plasma having low damage and high-density, and also possible to solve the problems of conventional capacitively coupled plasma processing apparatus or conventional microwave plasma processing apparatus described above.

Figure 8:
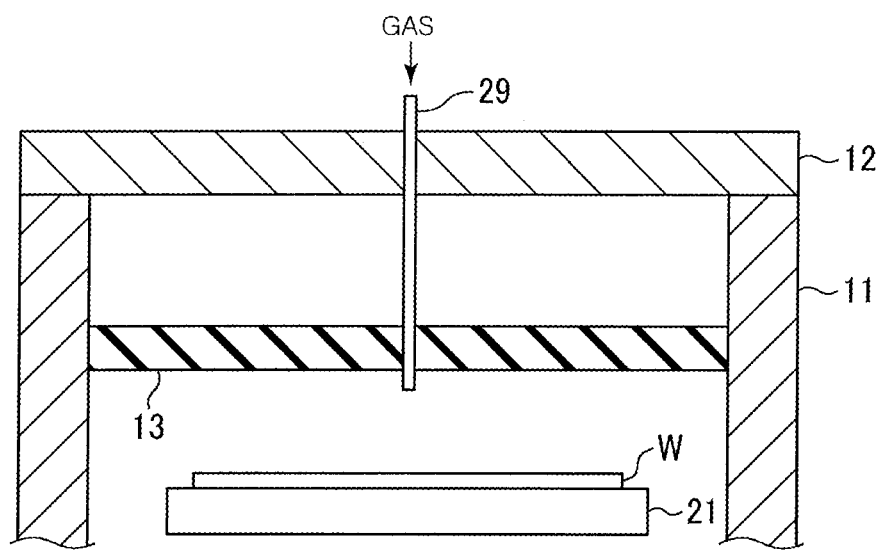
FIG. 8 shows an arrangement of a gas introducing member according to one embodiment.

Since the gas supply unit 4 is configured to supply a gas from the central portion of the dielectric window 13 to the central portion of the substrate W through the gas introducing member 29, the gas can spread uniformly on the substrate W by an exhaust flow and uniform processing can be performed. The electromagnetic simulation has confirmed that even if the gas is introduced from the central portion of the dielectric window 13, the concentration of the electromagnetic waves and the high-speed movement of the concentrating portion by the phase control are not interfered. In order to reliably realize the concentration of the electromagnetic waves and the movement of the concentrating portion by the phase control, it is preferable that the number of gas introducing members is small. From the above, in one embodiment gas is supplied from the central portion of the dielectric window 13 to the central portion of the substrate W. Further, in the present embodiment, the gas introducing member 29 is disposed away from the center of the substrate at a position where the electromagnetic wave radiation unit 34 does not exist in a position corresponding to the central portion of the substrate W. However, if the arrangement of the electromagnetic wave radiation units 34 allows, in one embodiment the gas introducing member 29 is disposed at a position that allows the gas to be supplied from the center of the dielectric window 13 to the center of the substrate W, as shown in FIG. 8.

In the plasma processing of step 1 or step 3, the operation of supplying plasma to the entire substrate by the high-speed movement of the localized plasma due to the high-speed movement of the concentrating portion of the electromagnetic wave is repeated a number of times corresponding to the period of the step. For example, on the assumption that the period of step 1 is 0.5 sec and the time for supplying the localized plasma to the entire substrate is 0.1 sec, in step 1, the operation of supplying the localized plasma to the entire substrate is repeated five times.

Next, the phase control of the electromagnetic waves in the antenna unit 2 will be described in detail with reference to FIGS. 9 to 11.

Figure 9:
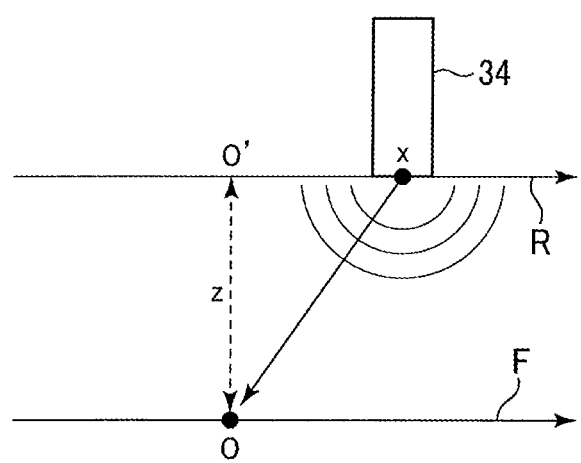
FIG. 9 schematically explains a principle of concentrating electromagnetic waves in the plasma processing apparatus according to one embodiment.

FIG. 9 schematically explains a principle of concentrating electromagnetic waves in the plasma processing apparatus 100 according to the embodiment. The gas supply unit 4 is omitted in FIG. 9. A back surface of the ceiling plate 12 where a position where the electromagnetic waves are radiated from the electromagnetic wave radiation unit 34 (the antenna 36) exists is set to a radiation surface R. A surface of the dielectric window 13 to which the electromagnetic waves are irradiated is set to an irradiation surface F. A distance between the radiation surface R and the irradiation surface F is set to z. A position on the irradiation surface F where the electromagnetic waves are to be concentrated is set to O. A position on the radiation surface R corresponding to the position O is set to O'. At this time, the phase of the electromagnetic wave radiated from the electromagnetic wave radiation unit 34 separated from the position O' by x is considered. The distance between the position O where the electromagnetic waves are to be concentrated and the position O' is z, and the distance between the position O and the electromagnetic wave radiation position x of the electromagnetic wave radiation unit 34 is $(x^2+z^2)^{1/2}$. On the assumption that the number of waves of the electromagnetic wave is k ($=2\pi/\lambda$ ($\lambda$ being the wavelength of the electromagnetic wave) and the phase at the position O of the electromagnetic wave radiated from the position x (i.e., the phase difference between the phase at the position O of the electromagnetic wave radiated from the position x and the phase at the position O of the electromagnetic wave radiated from the position O') is set to $\delta(x)$, the following equation (1) is satisfied.

$$k(x^2+z^2)^{1/2}-\delta(x)=kz \quad \text{Eq. (1)}$$

Eq. (1) can be modified to the following Eq. (2) for obtaining the phase $\delta(x)$.

$$\delta(x)=k\{(x^2+z^2)^{1/2}-z\} \quad \text{Eq. (2)}$$

Figure 10:
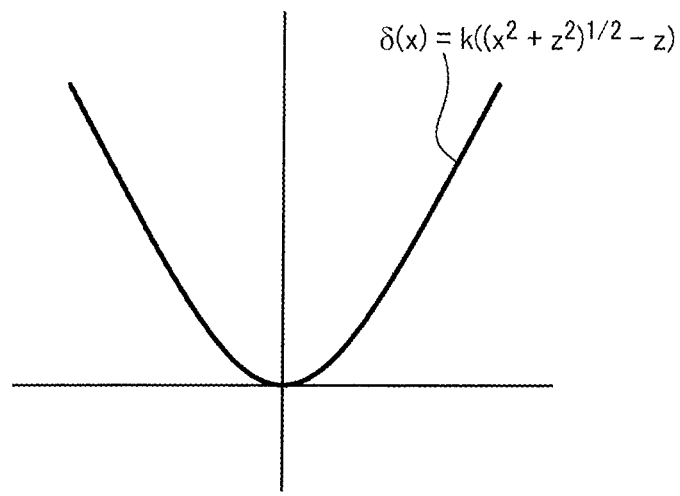
FIG. 10 shows coordinates of a phase δ(x) at a position O of the electromagnetic wave radiated from an electromagnetic wave radiation position x according to one embodiment.

When δ(x) is expressed on coordinates as a function of x, the curve shown in FIG. 10 is obtained.

The phase δ(x) can be recognized as the deviation in the traveling direction of the electromagnetic wave reaching from the position O' to the position O and the electromagnetic wave reaching from the position x to the position O, and increases as the electromagnetic wave radiation position of the electromagnetic wave radiation unit 34 becomes distant from the position o' (i.e., as the absolute value of x increases). Therefore, the electromagnetic waves radiated from the electromagnetic wave radiation units 34 can be strengthened at the position O by advancing or delaying the phase θ of the electromagnetic waves radiated from the electromagnetic wave radiation unit 34 depending on the value of the phase δ(x).

Figure 11:
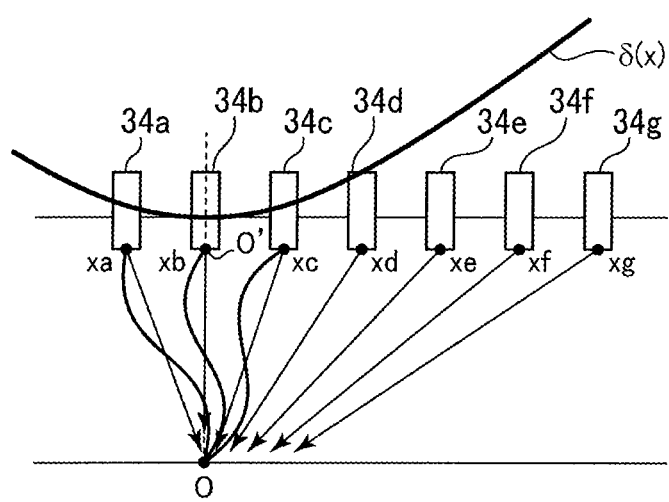
FIG. 11 schematically shows arrangement of antennas and phases at the position O according to one embodiment.

For example, as shown in FIG. 11, seven electromagnetic wave radiation units 34a, 34b, 34c, 34d, 34e, 34f, and 34g are disposed, and the electromagnetic wave radiation position of the electromagnetic wave radiation unit 34b is located at the position O' and the electromagnetic wave radiation positions of other electromagnetic wave radiation units are distant from the position O'. For convenience of description, in FIG. 11, the electromagnetic wave radiation units are arranged horizontally unlike the actual positions thereof.

xa to xg indicate x-direction positions of the electromagnetic wave radiation positions of the electromagnetic wave radiation units 34a to 34g. Since the distances between these positions and the position O where the electromagnetic waves are to be concentrated are different, the phase shift occurs at the position O in the case of radiating the electromagnetic waves at the same phase, and it is difficult to increase the electromagnetic wave intensity without the interference of the electromagnetic waves. Therefore, the phases θ of the electromagnetic waves radiated from electromagnetic wave radiation units 34 are respectively shifted by the phases (the phase differences) δ(x) corresponding to the x-direction positions of the electromagnetic wave radiation units 34a to 34g, and the phases at the position O of the electromagnetic waves radiated from electromagnetic wave radiation units are matched. Accordingly, the interference of the electromagnetic waves occurs at the position O to strengthen the electromagnetic waves, and the electromagnetic waves are concentrated at the position O to increase the electric field intensity locally. FIG. 11 shows that the phases of the electromagnetic waves radiated from the electromagnetic wave radiation units 34a, 34b, and 34c are matched at the position O, and the electromagnetic waves are strengthened by the interference.

However, it is unnecessary to perform the phase control for strengthening the electromagnetic waves at the concentrating position O for all the electromagnetic wave radiation units 34a to 34g as long as the desired electric field intensity can be obtained by the interference of the electromagnetic waves at the position O, and the phase control may be performed for two or more appropriate number of electromagnetic wave radiation units. Although the number of the concentrating position in the dielectric window 13 is one in the above description, the present disclosure is not limited thereto, and the control for strengthening the phase may be performed at two or more positions of the dielectric window 13 at the same timing.

The distance from the center of the electromagnetic wave radiation unit 34 to the center of the adjacent electromagnetic wave radiation unit 34 is smaller than λ/2 in the case where the wavelength of the electromagnetic wave is set to λ in one embodiment. This is because if the distance (gap) between the adjacent electromagnetic wave radiation units 34 is greater than λ/2, it is difficult to perform the control for strengthening the phase of the electromagnetic wave at the position O of the dielectric window 13 where the electromagnetic waves are to be concentrated.

Since the concentration of the electromagnetic waves utilizes the interference of the electromagnetic waves by the phase control, the concentrating portion can be moved at a high speed only by the phase control without a mechanical operation. In principle, the concentrating portion can be moved at a speed similar to the frequency of the electromagnetic waves.

Figure 12:
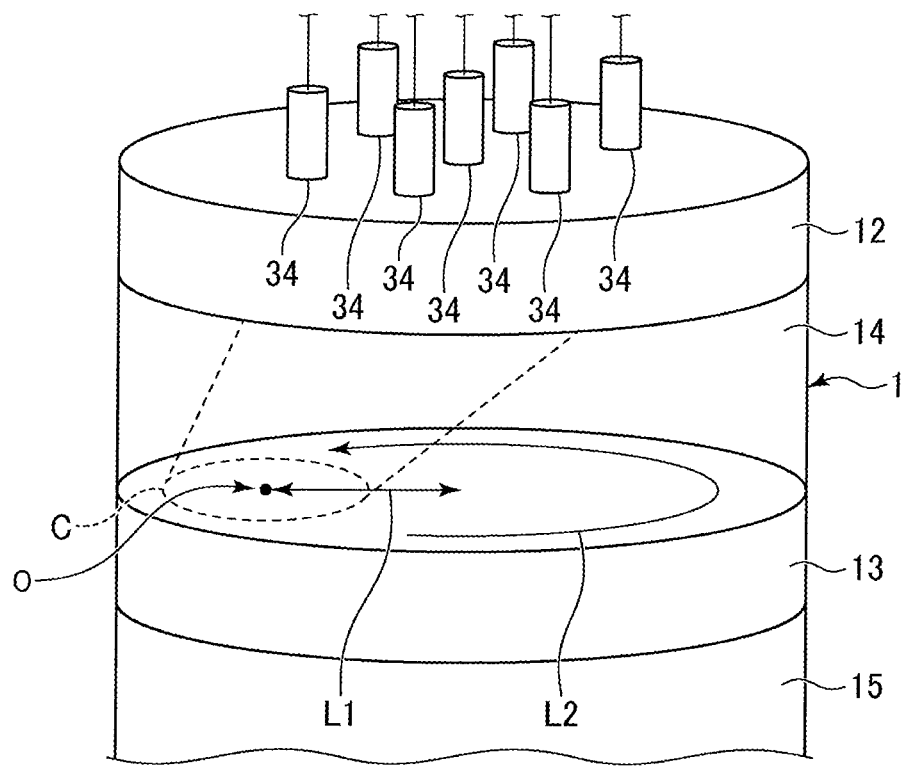
FIG. 12 schematically shows a state in which a concentrating portion of a dielectric window is scanned by phase control according to one embodiment.

FIG. 12 shows an example of the concentration of the electromagnetic waves by the phase control and the scanning of the concentrating portion. In the example of FIG. 12, the controller 5 controls the phase shifters 32 (the controller 5 and the phase shifters 32 are not shown in FIG. 12) to strengthen the phases of the electromagnetic waves radiated from the seven electromagnetic wave radiation units 34 respectively at the position O. Hence, the concentrating portion C is formed in an area around the position O, and the electric field of the electromagnetic waves is strengthened at the concentrating portion C. FIG. 12 schematically shows the above control. The phases of the electromagnetic waves radiated from the seven electromagnetic wave radiation units 34 are controlled at a high speed so that the concentrating portion C is scanned on the surface of the dielectric window 13 in a radial direction L1 and a circumferential direction L2 by the phase control of the phase shifter 32.

Further, the controller 5 controls the phase shifters 32 to change the moving speed of the concentrating portion C by the phase control of the electromagnetic waves radiated from the electromagnetic wave radiation units 34, thereby freely controlling average electric field distribution per unit time. For example, the phases of the electromagnetic waves are controlled such that the concentrating portion C moves at a relatively low speed on the outer peripheral side of the dielectric window 13 and moves at a relatively high speed on the inner peripheral side of the dielectric window 13. Accordingly, the electric field intensity can be higher on the outer peripheral side of the dielectric window 13 than on the inner peripheral side, and the plasma density on the outer peripheral side under the dielectric window 13 can be controlled to be higher than the plasma density on the inner peripheral side of the dielectric field 13.

Figure 13:
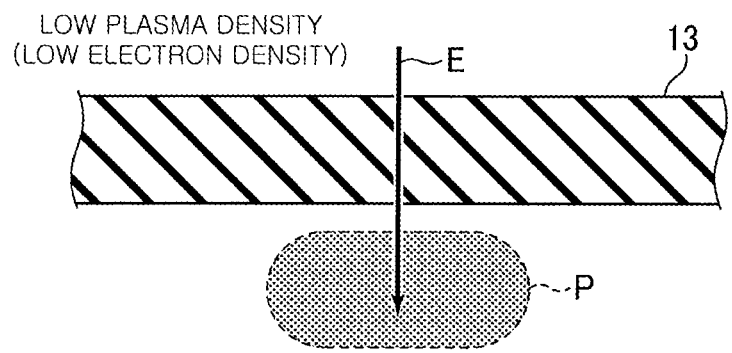
FIG. 13 shows a relationship between an electromagnetic wave and plasma in the case of low-density plasma according to one embodiment.
Figure 14:
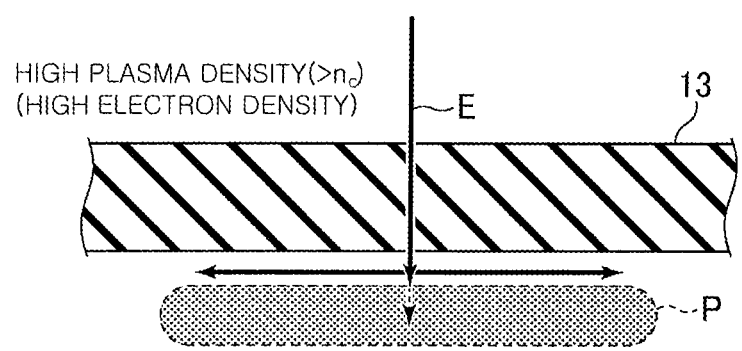
FIG. 14 shows a relationship between an electromagnetic wave and plasma in the case of high-density plasma according to one embodiment.

In the case of using the antenna unit 2 serving as a phased array antenna, when the plasma density is relatively low (low electron density), the electromagnetic waves E that have transmitted through the dielectric window 13 penetrate into the plasma P in the processing space 15 to some extent as shown in FIG. 13. Therefore, the plasma is less likely to spread in an in-plane direction, and localized plasma can be generated without problems. By moving the localized plasma at a high speed, uniform plasma can be obtained. However, when the plasma density increases, the plasma spreads, which may make it difficult to generate the localized plasma which is the object of the phased array antenna. Specifically, when the plasma density (electron density) exceeds a cutoff density $n_c$ represented by the following equation that depends on the frequency, the electromagnetic waves penetrating into the plasma are attenuated and the electromagnetic waves and the plasma are more likely to spread in the in-plane direction as shown in FIG. 14.

$$n_e = \frac{m_e \epsilon_0 \omega^2}{e^2}$$

-continued $\omega = 2\pi f$ $m_e$: electron mass $(=9.1093 \times 10^{-31}$ kg$)$ $\epsilon_0$: permittivity of vacuum $(=8.8542 \times 10^{-12}$ F/m$)$ $e$: elementary charge of electrons $(=1.6022 \times 10^{-19}$ C$)$ $\omega$: electromagnetic wave angular frequency [rad/s]

$f$: electromagnetic wave frequency[/s]

For example, when the frequency of the electromagnetic waves is 860 MHZ, $n_c$ is $9.1743 \times 10^9$ [cm$^{-3}$].

Figure 15:
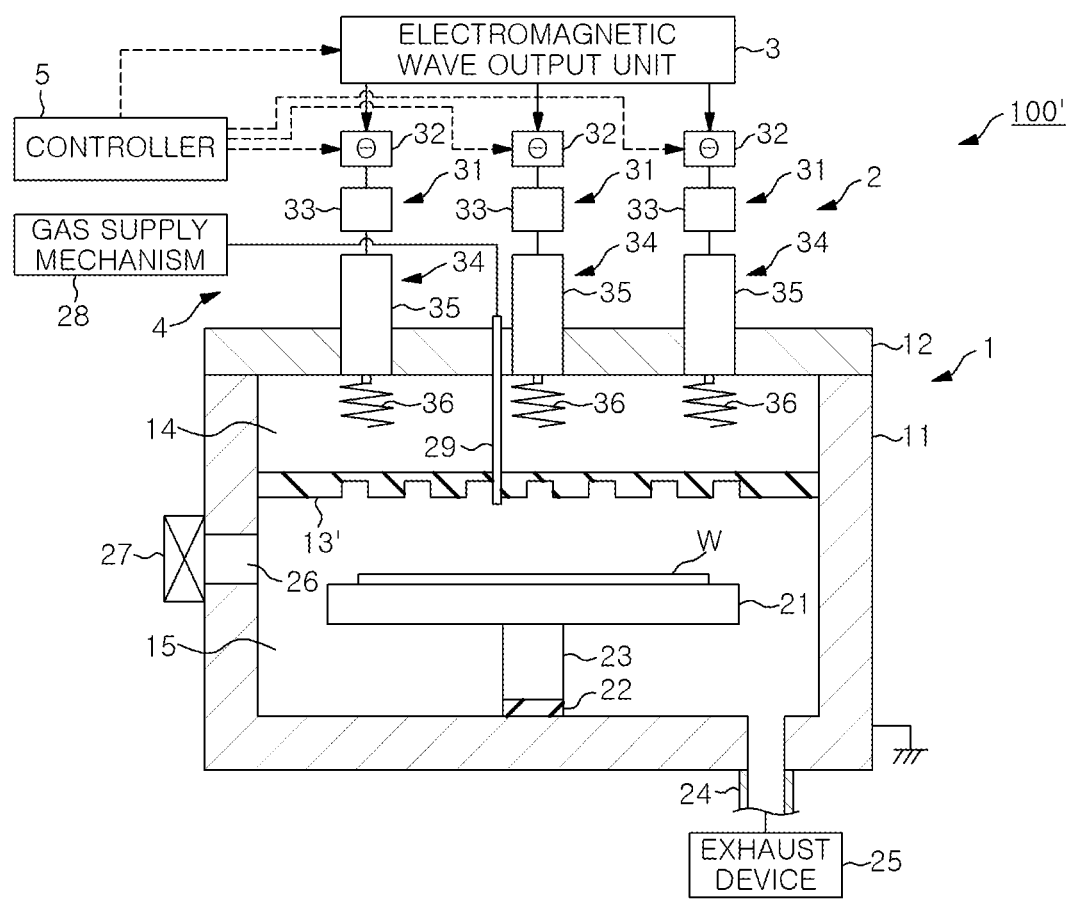
FIG. 15 is a cross-sectional view showing a plasma processing apparatus according to another embodiment.
Figure 16:
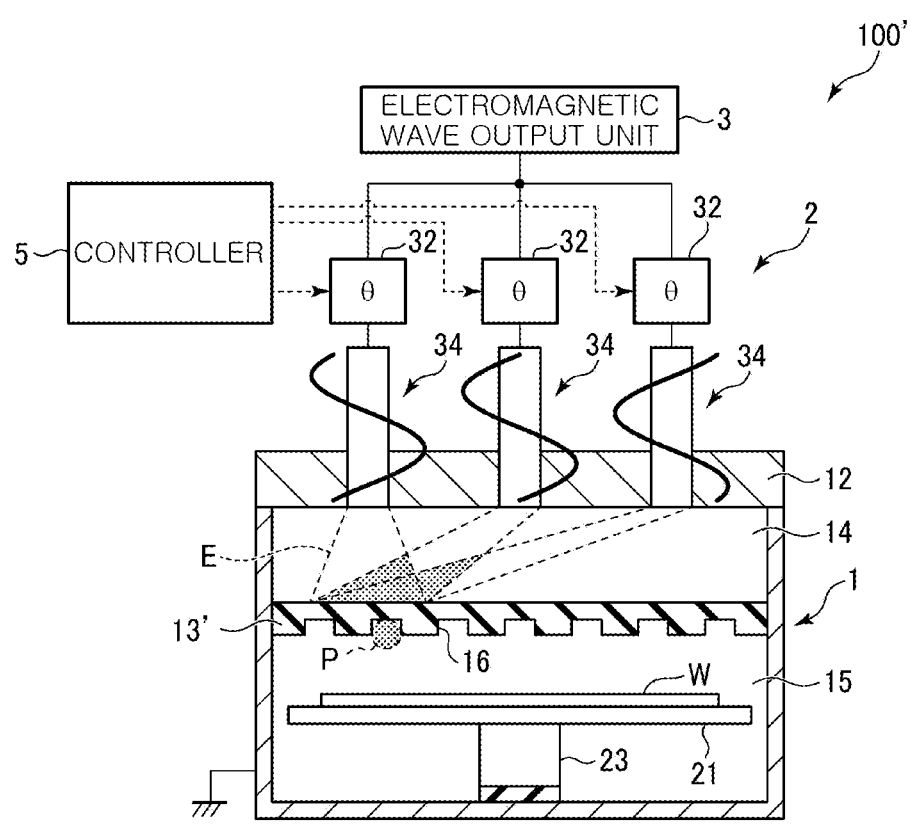
FIG. 16 is a cross-sectional view for explaining a processing state of the plasma processing apparatus according to another embodiment.

In this case, it is preferable to use a plasma processing apparatus 100' shown in FIG. 15 that includes a dielectric window 13' having a plurality of recesses 16 on a surface on the processing space 15 side. Accordingly, even when the plasma density is higher than the cutoff density $n_c$ and the plasma is likely to spread in the in-plane direction, the spread of the plasma in the in-plane direction can be suppressed by generating plasma in the recess 16 corresponding to the concentrating portion of the electromagnetic wave as shown in FIG. 16. Further, the plasma generated in the recess 16 can also move to another recess 16 at a high speed by the high-speed movement of the concentrating portion C of the electromagnetic waves, which makes it possible to perform uniform plasma processing.

Since the spread of the plasma can be suppressed by forming the recesses 16, it is possible to reliably realize a process that inflicts less damage using pseudo pulse plasma by high-speed phase control even at a high-plasma density, which is more suitable for the ALD film formation.

<Other Applications>

While various embodiments have been described above, the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, the configuration of the antenna module is not limited to that of the above-described embodiment. For example, the phase shifter may be disposed at the antenna, instead of at the amplifier unit, or the phase shifter and the amplifier unit may be integrated. Further, the configuration of the electromagnetic wave output unit is not limited to that of the above-described embodiment.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
a chamber having a processing space for performing plasma processing on a substrate and a combining space for combining electromagnetic waves;
a dielectric window that separates the processing space from the combining space, wherein the dielectric window has a plurality of recesses on a surface on the processing space;
an antenna unit having a plurality of antennas configured to radiate the electromagnetic waves to the combining space and functioning as a phased array antenna;
an electromagnetic wave output unit configured to output the electromagnetic waves to the antenna unit;
a stage on which the substrate is placed in the processing space;
a gas supply unit configured to supply a gas for atomic layer deposition (ALD) film formation to the processing space without the supplying the gas to the combining space; and
a controller configured to control the gas supply unit to supply the gas to perform the ALD film formation and control localized plasma generated in one recess of the plurality of recesses in the processing space but not the combining space to move to another recess of the plurality of recesses at a high speed in the processing space by causing the antenna unit to function as the phased array antenna.

2. The plasma processing apparatus of claim 1, wherein the gas supply unit supplies a first gas and a second gas for performing the ALD film formation, and a purge gas for purging the processing space, and
the controller controls the first gas and the second gas to be alternately supplied to the processing space with the supply of the purge gas interposed therebetween.

3. The plasma processing apparatus of claim 2, wherein the controller controls phases of the electromagnetic waves radiated from the plurality of antennas such that a concentrating portion is formed at any position on a surface of the dielectric window by interference and the concentrating portion is moved at the high speed, during a period in which the first gas and/or the second gas is supplied.

4. The plasma processing apparatus of claim 3, wherein the controller controls average electric field distribution per unit time by changing a moving speed of the concentrating portion by controlling the phases.

5. The plasma processing apparatus of claim 1, wherein the electromagnetic waves have a frequency in a microwave band, and a gap between the dielectric window and the stage is 70 mm or less.

6. The plasma processing apparatus of claim 1, wherein the gas supply unit supplies the gas from a position of the dielectric window corresponding to a central portion of the substrate.

7. A plasma processing method for performing plasma processing on a substrate using a plasma processing apparatus, wherein the plasma processing apparatus includes: a chamber having a processing space for performing the plasma processing on the substrate and a combining space for combining electromagnetic waves; a dielectric window that separates the processing space from the combining space, wherein the dielectric window has a plurality of recesses on a surface on the processing space; an antenna unit having a plurality of antennas configured to radiate the electromagnetic waves to the combining space and functioning as a phased array antenna; a stage on which the substrate is placed in the processing space; and a gas supply unit configured to supply a gas for atomic layer deposition (ALD) film formation to the processing space, the plasma processing method comprising:
placing the substrate on the stage that is in the processing space of the chamber;

supplying the gas from the gas supply unit to the processing space without the gas being supplied to the combining space to perform the ALD film formation;

concentrating the electromagnetic waves radiated by the plurality of antennas in the combining space to certain portions of a surface of the dielectric window in the combining space and generating localized plasma in the processing space without the localized plasma being generated in the combining space; and moving the localized plasma generated in one recess of the plurality of recesses to another recess of the plurality of recesses at a high speed in the processing space by causing the antenna unit to function as the phased array antenna that concentrates the electromagnetic waves radiated by the plurality of antennas to another surface of the dielectric window that overlaps the other recess.

8. The plasma processing method of claim 7, wherein in supplying the gas, a first gas and a second gas are alternately supplied from the gas supply unit to the processing space with a supply of a purge gas interposed therebetween.

9. The plasma processing method of claim 8, wherein in moving the localized plasma at a high speed, phases of the electromagnetic waves radiated from the plurality of antennas are controlled such that a concentrating portion is formed at any position on a surface of the dielectric window by interference and the concentrating portion is moved at the high speed, during a period in which the first gas and/or the second gas is supplied.

10. The plasma processing method of claim 9, wherein average electric field distribution per unit time is controlled by changing a moving speed of the concentrating portion by controlling the phases.

11. The plasma processing method of claim 7, wherein the electromagnetic waves have a frequency in a microwave band, and a gap between the dielectric window and the stage is 70 mm or less.

12. The plasma processing method of claim 7, wherein in said supplying the gas, the gas is supplied from a position of the dielectric window corresponding to a central portion of the substrate.

* * * * *